United States Patent
Kang et al.

(10) Patent No.: US 9,224,957 B1
(45) Date of Patent: Dec. 29, 2015

(54) METHOD FOR MEASURING OFFSET OF SUB-PIXEL IN OLED MANUFACTURING PROCESS

(71) Applicant: EverDisplay Optronics (Shanghai) Limited, Shanghai (CN)

(72) Inventors: ChiaPin Kang, Shanghai (CN); Chin Chih Lin, Shanghai (CN); Chunchieh Huang, Shanghai (CN)

( * ) Notice: Subject to any disclaimer, the term of this patent is extended or adjusted under 35 U.S.C. 154(b) by 0 days.

(21) Appl. No.: 14/681,663

(22) Filed: Apr. 8, 2015

(30) Foreign Application Priority Data

Jul. 25, 2014 (CN) .......................... 2014 1 0359638

(51) Int. Cl.
*H01L 51/00* (2006.01)
*H01L 51/56* (2006.01)
*H01L 27/32* (2006.01)

(52) U.S. Cl.
CPC ........ *H01L 51/0031* (2013.01); *H01L 27/3211* (2013.01); *H01L 27/3223* (2013.01); *H01L 51/56* (2013.01)

(58) Field of Classification Search
CPC ............ H01L 27/3211; H01L 27/3223; H01L 51/0031; H01L 51/56
USPC .............................................. 438/7
See application file for complete search history.

(56) References Cited

U.S. PATENT DOCUMENTS

2010/0245997 A1* 9/2010 Shinohara ......... G02F 1/133526
359/463

* cited by examiner

*Primary Examiner* — Daniel Shook
(74) *Attorney, Agent, or Firm* — Yunling Ren; Eaton & Van Winkle

(57) ABSTRACT

The present disclosure provides a method for measuring an offset of a sub-pixel in an OLED manufacturing process, including: depositing OLED material onto a display unit in a substrate through a hollow portion of a mask, the display unit including an effective region and a peripheral measuring region at periphery of the effective region, the OLED material forming a plurality of effective sub-pixels within the effective region and forming a plurality of dummy sub-pixels within the peripheral measuring region; and using UV light to excite at least a portion of the dummy sub-pixels of the OLED material to emit light, and measuring the offset of the dummy sub-pixel with respect to a predetermined position of a corresponding light emitting unit located on the substrate.

18 Claims, 5 Drawing Sheets

METHOD FOR MEASURING OFFSET OF SUB-PIXEL IN OLED MANUFACTURING PROCESS

CROSS REFERENCE TO RELATED APPLICATIONS

This application is based upon and claims priority to Chinese Patent Application No. 201410359638.4, filed on Jul. 25, 2014, the entire contents of which are incorporated herein by reference.

TECHNICAL FIELD

The present disclosure generally relates to a method for measuring an offset of a sub-pixel on an OLED substrate, and more particularly, to a method for measuring an offset of a sub-pixel on a substrate in an OLED manufacturing process.

BACKGROUND

With the tendency of high resolution and high yield of OLED manufacturing, the requirement for deposition accuracy is increasingly higher. Therefore, it is essentially important to measure the deposition offset and compensate for the offset accurately and quickly for meeting the above requirement.

FIG. 1 and FIG. 2 respectively illustrate a front view and a top view of OLED sub-pixels deposition by using a deposition equipment. The deposition equipment includes an evaporation source 1, a metal frame 2, a mask 3 and a glass substrate 4. The mask 3 is, for example, a fine metal mask (FMM), having a hollow portion 31 therein and fixed on the metal frame 2. Before evaporation, the glass substrate 4 and the mask 3 are set opposite in position, i.e., a predetermined position of a light emitting unit 41 on the glass substrate 4 is set to correspond to the hollow portion 31. The evaporation source 1 containing an OLED material is then evaporated to make the OLED material deposit on the light emitting unit 41 of the glass substrate 4 via the hollow portion 31 on the mask 3, forming RGB sub-pixels P, as shown in FIG. 3 and FIG. 4. Next, in the same manner, a multilayer structure is stacked and formed on the glass substrate 4 using masks in other layouts, so as to form three layers of sub-pixels respectively. After the OLED manufacturing process is completely finished, the glass substrate 4 is powered on to be lit up. Whether there exists an offset between the light emitting unit 41 and the deposited sub-pixel of the OLED material is observed after the glass substrate 4 is powered on, and the offset is measured.

Next, the offset is compensated by moving the glass substrate 4 or the mask 3, so as to avoid a reoccurrence of the offset.

However, the above offset measuring step can be carried out only when the glass substrate 4 is powered on after the OLED manufacturing process is completely finished. Therefore, even if the offset is detected and compensated, the deposition layer with the offset has severely affected the subsequent manufacturing process in fact. The defective substrates produced in large quantity cannot be compensated, and therefore cannot be used.

Therefore, the existing offset measurement method can discover and measure the offset only after the manufacturing process is completed, which results in a lower manufacturing efficiency, a waste of raw materials, and a higher defective index.

Therefore, there needs a method for measuring an offset of the sub-pixel on the OLED substrate, so as to discover the deposition offset earlier, improve the manufacturing efficiency and increase the product yield.

The above information disclosed in the background section is only for enhancing the understanding of background of the present disclosure, therefore it may include the information which does not constitute the prior art known to those skilled in the art.

SUMMARY

The present disclosure discloses a method for measuring an offset of a sub-pixel in an OLED manufacturing process, so as to discover the deposition offset as early as possible, improve the manufacturing efficiency and increase the product yield.

The additional aspects and advantages of the present disclosure will be partly illustrated in the following description, and will partly become apparent from the description, or may be learned by the practice of the present disclosure.

According to one aspect of the present disclosure, there is provided a method for measuring an offset of a sub-pixel in an OLED manufacturing process, including: depositing OLED material onto a display unit in a substrate through a hollow portion of a mask, the display unit including an effective region and a peripheral measuring region at periphery of the effective region, the OLED material forming a plurality of effective sub-pixels within the effective region and forming a plurality of dummy sub-pixels within the peripheral measuring region; and using UV light to excite at least a portion of the dummy sub-pixels of the OLED material to emit light, and measuring the offset of the dummy sub-pixel with respect to a predetermined position of a corresponding light emitting unit located on the substrate.

BRIEF DESCRIPTION OF THE DRAWINGS

The exemplary embodiments of the disclosure will be described in detail with reference to the accompanying drawings, through which the above and other features and advantages of the disclosure will become more apparent.

DESCRIPTION OF THE EMBODIMENTS

Figure 1:
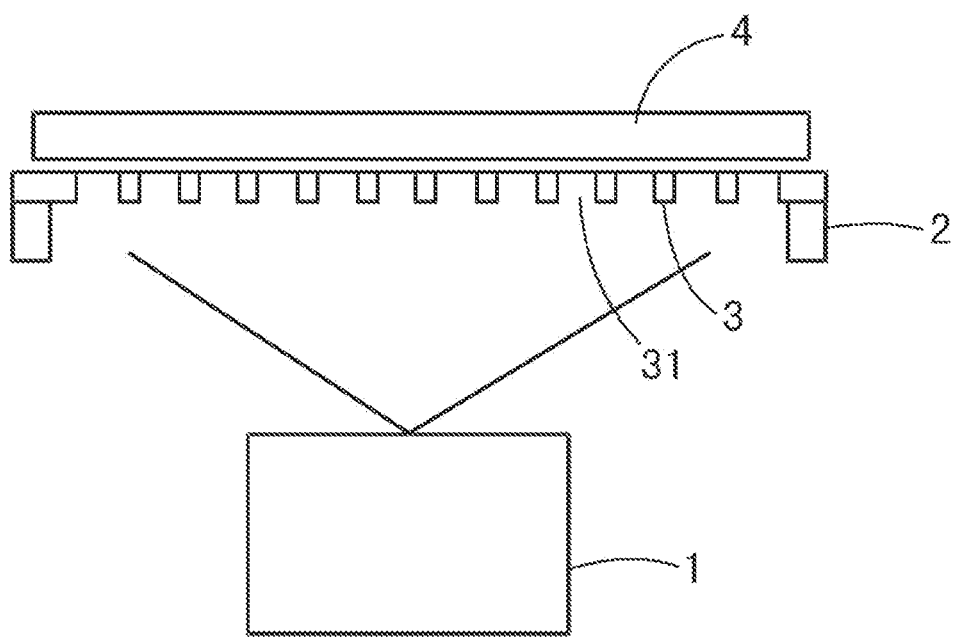
FIG. 1 is a front view showing a deposition using the existing deposition equipment.
Figure 2:
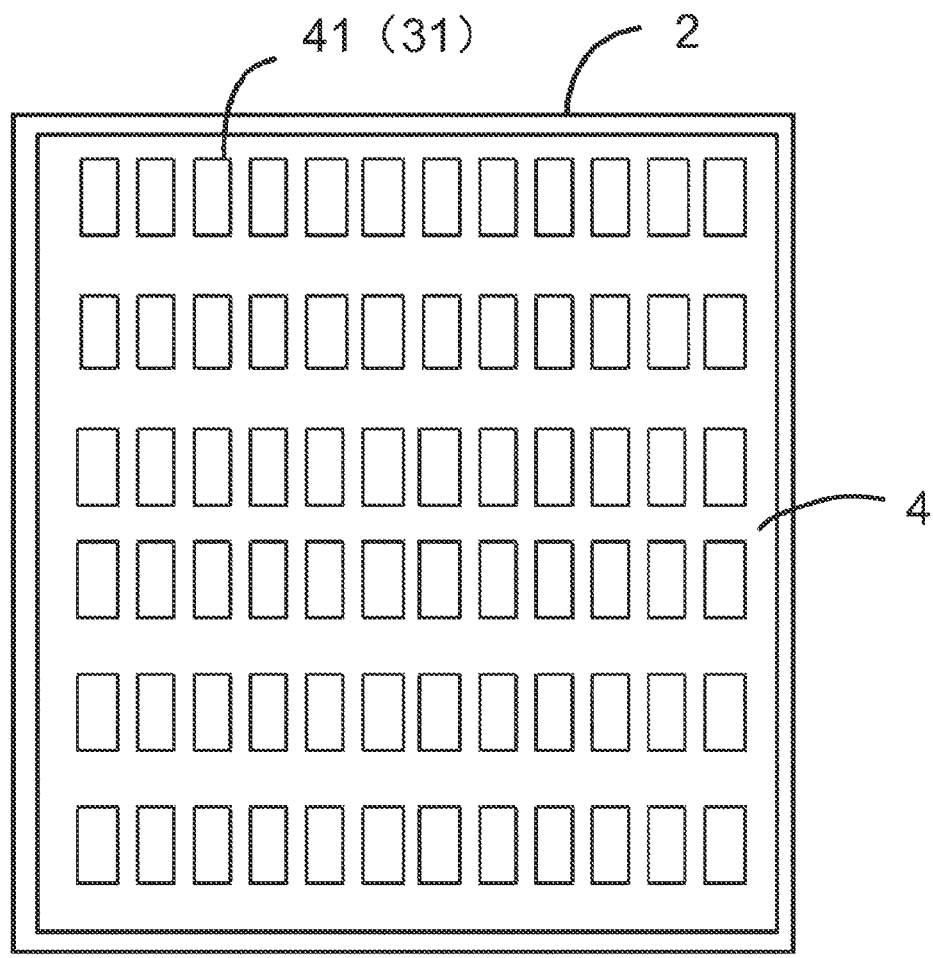
FIG. 2 is a top view showing a deposition using the existing deposition equipment.
Figure 3:
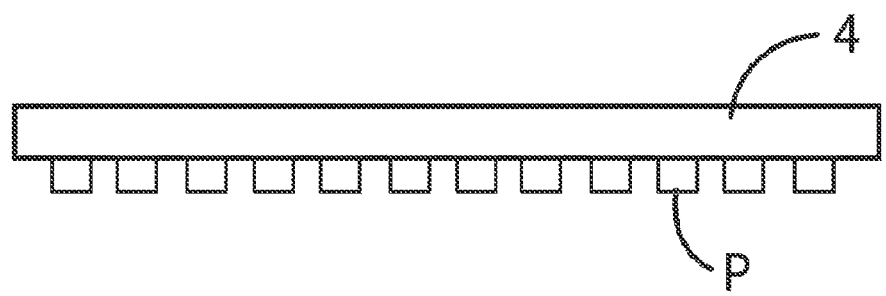
FIG. 3 is a front view showing a formation of sub-pixels on the substrate.
Figure 4:
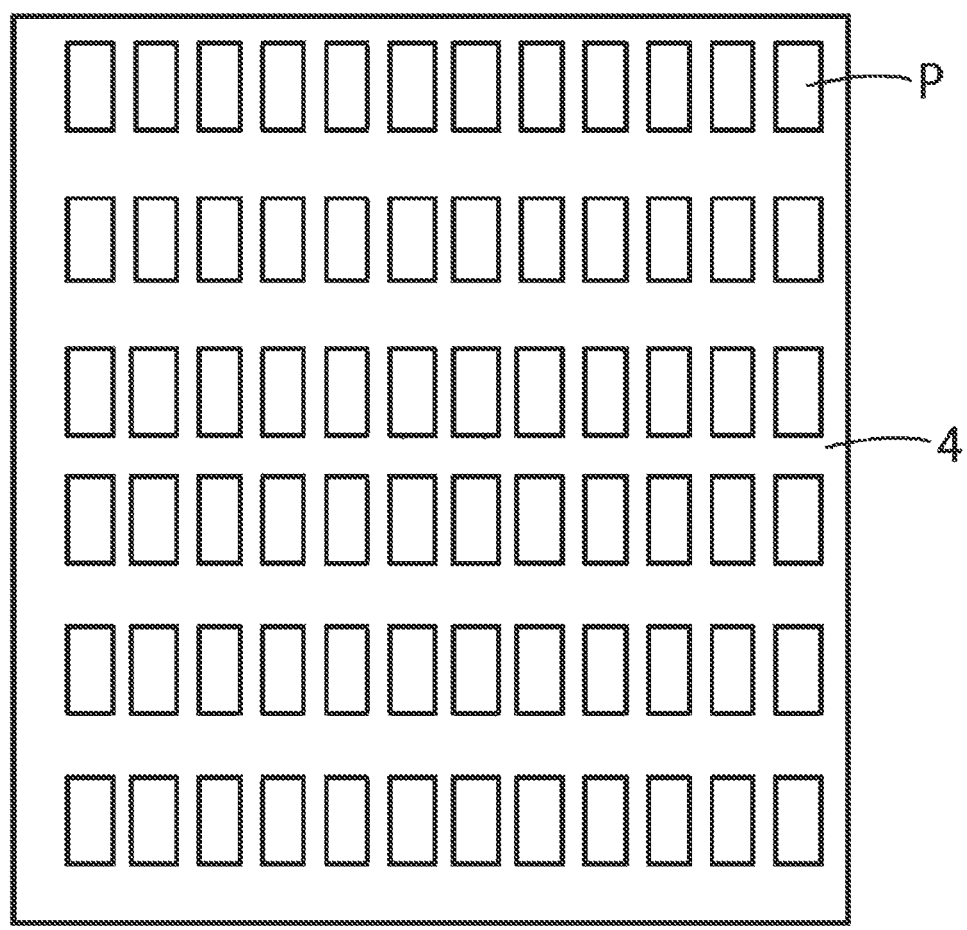
FIG. 4 is a top view showing a formation of sub-pixels on the substrate.

The exemplary embodiments will now be described more fully with reference to the accompanying drawings. However, the exemplary embodiments can be implemented in various forms and should not be understood as being limited to the embodiments set forth herein; on the contrary, these embodiments are provided so that this disclosure will be thorough and complete, and the conception of exemplary embodiments will be fully conveyed to those skilled in the art. In the drawings, the thicknesses of the regions and layers are exaggerated for clarity. In the drawings, the same reference numerals denote the same or similar structure, thus their detailed description will be omitted.

The described features, structures, or characteristics may be combined in one or more embodiments in any suitable manner. In the following description, numerous specific details are provided so as to allow a full understanding of the embodiments of the present disclosure. However, those skilled in the art will recognize that the technical solutions of the present disclosure may be practiced without one or more of the specific details, or other methods, components, materials and so on may be used. In other cases, the well-known structures, materials or operations are not shown or described in detail to avoid obscuring various aspects of the present disclosure.

First Embodiment

Figure 5:
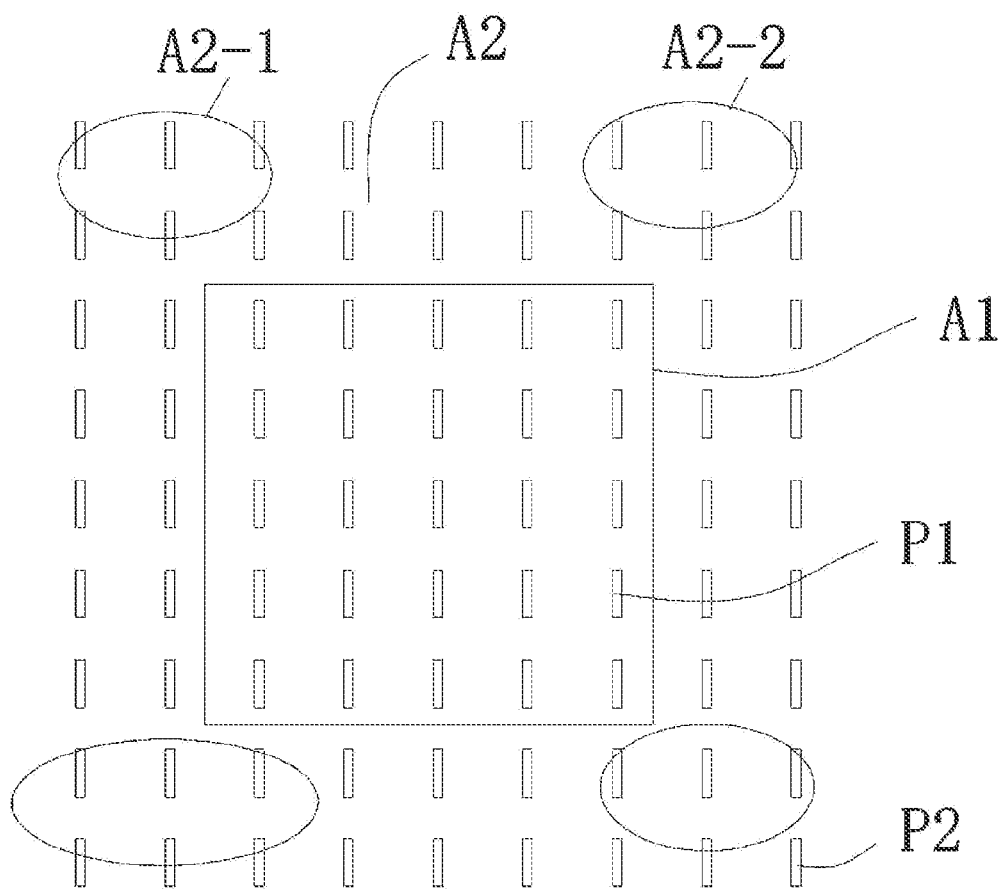
FIG. 5 is a schematic diagram showing the OLED display unit and the peripheral measuring regions at periphery thereof.
Figure 6:
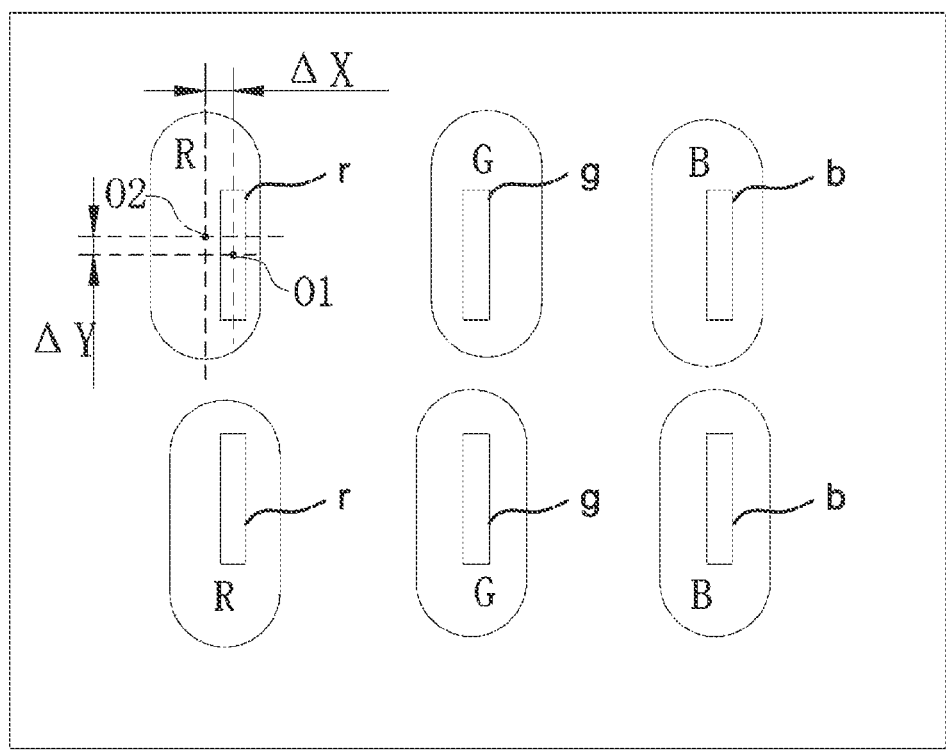
FIG. 6 is a schematic diagram showing the observed offset of the sub-pixel within the peripheral measuring region.

Please refer to FIG. 5 together with FIG. 6, the present embodiment provides a method for measuring an offset of a sub-pixel in an OLED manufacturing process, which is used for measuring the offset between the sub-pixel formed by deposition and the corresponding light emitting unit. The method includes the following steps.

In Step 1, an OLED material is deposited on a substrate 4 through a hollow portion 31 in a mask 3, forming a plurality of sub-pixels, so that each of the sub-pixels is corresponding to a light emitting unit 41 on the substrate 4 to form an OLED display unit 43. As shown in FIG. 5, the OLED display unit 43 includes an effective region A1 and a peripheral measuring region A2 at periphery of the effective region A1. The sub-pixels formed within the effective region A1 are defined as effective sub-pixels P1, and the sub-pixels formed within the peripheral measuring region A2 are defined as dummy sub-pixels P2. The distribution of the effective sub-pixels P1 is the same as that of the dummy sub-pixels P2.

In Step 2: please refer to FIG. 6 which is a partly enlarged view of the peripheral measuring region A2 in FIG. 5, for example, an enlarged view of the area A2-1. In FIG. 6, R, G, B respectively represent the position of the dummy sub-pixel P2 formed by red, green, blue OLED material actually deposited on the peripheral measuring area A2 in the substrate, while r, g, b respectively represent the position of the predetermined red, green, blue light emitting unit. An area of the dummy sub-pixel is larger than an area of the light emitting unit. UV light is used to excite the red dummy sub-pixel R of the OLED material to emit light, and an offset D1 of the red dummy sub-pixel R with respect to a predetermined position of the corresponding red light emitting unit r is observed and measured. The offset of the dummy sub-pixels P2 within the peripheral measuring area A2 is consistent with the offset D2 of the effective sub-pixels P1 within the effective area A1, and the offset D2 is consistent with the offset D3 of the mask 3 with respect to the substrate 4. Therefore, the offset D3 can be determined by observing and measuring the offset D1.

In the present embodiment, a measuring microscope equipped with a UV light source is used to observe an image of the dummy sub-pixel P2, and the UV light source is transmitted by way of optical fiber and is irradiated at the peripheral measuring region A2 on the substrate 4. The irradiation range of the UV light is within 0.5 mm. Measurement can be conducted at a plurality of regions within the peripheral measuring region A2, for example, a plurality of the circled measurement portions A2-1, A2-2 . . . at periphery of the effective region A1, as shown in FIG. 5. There is no limitation to the measurement position at the peripheral region of each block unit and the number of the measurement points. FIG. 6 is a schematic diagram showing the observed offset of the dummy sub-pixel P2 within the peripheral measuring region A2. Taking the offset of the predetermined red light emitting unit r as an example, the center of the predetermined red light emitting unit r is O1, and the center of dummy sub-pixel R of the OLED material formed by deposition is O2. The offset D1 between the center O1 and the center O2 is shown in FIG. 6. The offset D1 includes the widthwise offset ΔX in X direction and the lengthwise offset ΔY in Y direction between the center O1 of the predetermined light emitting unit and the center O2 of the dummy sub-pixel R. The offsets of a plurality of dummy sub-pixels R in the peripheral measuring region of the OLED display unit 43 can be measured in the same manner, and then an average offset D2 of the effective sub-pixels R within the effective area A1 is calculated, then an average offset D3 of the substrate or the mask can be obtained according to the average offset D2.

In addition, Step 3 may be further performed after the offset D3 is determined. In Step 3, the measured offset value is fed back to the deposition equipment of the OLED manufacturing process. The deposition equipment adjusts the position of the substrate 4 or the mask 3 or adjusts positions of both the substrate 4 and the mask 3 according to the offset value to align the substrate with the mask, so as to achieve the aim of offset compensation.

The above method for measuring offset of the sub-pixel determines the offset of the sub-pixel by exciting the OLED material using UV light and observing the sub-pixel position of the OLED material within the peripheral measuring region at periphery of the effective region. Thus, the offset of the sub-pixel can be obtained in advance, without waiting for the completion of the circuit manufacturing process to power on the light emitting unit on the substrate to light it up.

In practice, the mask 3 is fixed on the metal frame 2, the overall weight of which is heavy and is not convenient to move. Therefore, in the present exemplary embodiment, the compensation action of the deposition equipment is to adjust the substrate 4, so as to align the hollow portion 31 in the mask 3 with the light emitting unit 41 on the substrate 4.

Second Embodiment

The present embodiment is substantially the same as the first embodiment, but the difference lies in: in the first embodiment, the offsets D1 of a plurality of dummy sub-pixels in the peripheral measuring region of one OLED display unit 43 are measured, then obtaining the offset D3 of the mask 3 with respect to the substrate 4 and making compensation adjustment; while in the second embodiment, the peripheral measuring region to be measured is not limited to the peripheral measuring region of one OLED display unit 43. One mask 3 may usually cover a plurality of OLED display units 43. Therefore, in the second embodiment, the offsets D1 of a plurality of dummy sub-pixels may be measured in the peripheral measuring regions of a plurality of OLED display units 43, in order to obtain a more accurate offset D3 of the mask 3 with respect to the substrate 4. In the present exemplary embodiment, for example, the peripheral measuring regions of a plurality of OLED display units 43 distributed on the top, bottom, left and right of the mask 3 are chosen to be measured, such that a more accurate average offset D1 may be obtained, causing the offset adjustment of the mask 3 with respect to the substrate 4 to be more accurate.

The measurement manner with regard to the offset is the same as that of the first embodiment, which will not be repeated herein.

The method for measuring the offset of the sub-pixel in OLED manufacturing process according to the present disclosure may be carried out each time after one-layer of sub-pixel film is formed by deposition, so that the offset may be discovered and compensated as early as possible.

In conclusion, the present disclosure determines the offset of the mask with respect to the substrate according to the offset of the sub-pixels by exciting and observing the sub-pixels of the OLED material within the peripheral measuring region at periphery of the effective region. Therefore, the present disclosure can be carried out during the OLED manufacturing process. There is no necessity to wait, as in the related art, until the OLED substrate deposition and the subsequent circuit manufacturing process are fully completed to power on the substrate to detect the offset. Therefore, the present disclosure can discover and compensate the deposition offset as early as possible, improve the manufacturing efficiency and increase the product yield. The method of the present disclosure is easy to operate and has high measurement accuracy.

The exemplary embodiments of the present disclosure are shown and described in detail above. It should be understood that the present disclosure is not limited to the disclosed embodiments. Instead, the present disclosure is intended to encompass various modifications and equivalent arrangements within the spirit and scope of the appended claims.

What is claimed is:

1. A method for measuring an offset of a sub-pixel in an OLED manufacturing process, comprising:
   depositing OLED material onto a display unit in a substrate through a hollow portion of a mask, the display unit comprising an effective region and a peripheral measuring region at periphery of the effective region, the OLED material forming a plurality of effective sub-pixels within the effective region and forming a plurality of dummy sub-pixels within the peripheral measuring region; and
   using UV light to excite at least a portion of the dummy sub-pixels of the OLED material to emit light, and measuring the offset of the dummy sub-pixel with respect to a predetermined position of a corresponding light emitting unit located on the substrate.

2. The method for measuring the offset of the sub-pixel according to claim 1, wherein, an area of each of the plurality of dummy sub-pixels is larger than an area of the light emitting unit.

3. The method for measuring the offset of the sub-pixel according to claim 2, wherein, said measuring the offset of the sub-pixel is performed prior to a circuit manufacturing process of an OLED Display.

4. The method for measuring the offset of the sub-pixel according to claim 1, wherein, the offset comprises a widthwise offset and a lengthwise offset.

5. The method for measuring the offset of the sub-pixel according to claim 4, wherein, the widthwise offset means an offset of a center of the dummy sub-pixel with respect to a center of the corresponding light emitting unit in a widthwise direction, and the lengthwise offset means an offset of a center of the dummy sub-pixel with respect to a center of the corresponding light emitting unit in a lengthwise direction.

6. The method for measuring the offset of the sub-pixel according to claim 5, wherein, said measuring the offset of the sub-pixel is performed prior to a circuit manufacturing process of an OLED Display.

7. The method for measuring the offset of the sub-pixel according to claim 4, wherein, said measuring the offset of the sub-pixel is performed prior to a circuit manufacturing process of an OLED Display.

8. The method for measuring the offset of the sub-pixel according to claim 1, wherein, a measuring microscope equipped with a UV light source is used to observe an image of the dummy sub-pixels and measure the offset of the depositing.

9. The method for measuring the offset of the sub-pixel according to claim 8, wherein, the UV light source is transmitted by way of optical fiber and is irradiated on the substrate.

10. The method for measuring the offset of the sub-pixel according to claim 9, wherein, said measuring the offset of the sub-pixel is performed prior to a circuit manufacturing process of an OLED Display.

11. The method for measuring the offset of the sub-pixel according to claim 8, wherein, said measuring the offset of the sub-pixel is performed prior to a circuit manufacturing process of an OLED Display.

12. The method for measuring the offset of the sub-pixel according to claim 1, further comprising:
   feeding back the measured offset value of the dummy sub-pixels to a deposition equipment of the OLED manufacturing process, and adjusting, by the deposition equipment, a position of the substrate or the mask according to the offset value so as to align the substrate with the mask.

13. The method for measuring the offset of the sub-pixel according to claim 12, wherein, said measuring the offset of the sub-pixel is performed prior to a circuit manufacturing process of an OLED Display.

14. The method for measuring the offset of the sub-pixel according to claim 1, wherein, the substrate comprises a plurality of display units, and measuring the offset further comprises measuring the offsets of a plurality of dummy sub-pixels in the peripheral measuring regions of different display units with respect to the predetermined positions of the corresponding light emitting units on the substrate.

15. The method for measuring the offset of the sub-pixel according to claim 14, wherein, the offsets are respectively measured at a plurality of positions within a plurality of the peripheral measuring regions and an average offset is calculated, the average offset serving as the offset for adjusting the mask with respect to the substrate.

16. The method for measuring the offset of the sub-pixel according to claim 15, wherein, said measuring the offset of the sub-pixel is performed prior to a circuit manufacturing process of an OLED Display.

17. The method for measuring the offset of the sub-pixel according to claim 14, wherein, said measuring the offset of the sub-pixel is performed prior to a circuit manufacturing process of an OLED Display.

18. The method for measuring the offset of the sub-pixel according to claim 1, wherein, said measuring the offset of the sub-pixel is performed prior to a circuit manufacturing process of an OLED Display.

* * * * *